United States Patent
Matsubara et al.

(10) Patent No.: US 9,461,592 B2
(45) Date of Patent: Oct. 4, 2016

(54) DISTORTION COMPENSATION DEVICE

(71) Applicant: FUJITSU LIMITED, Kawasaki-shi, Kanagawa (JP)

(72) Inventors: Satoshi Matsubara, Kawasaki (JP); Hideharu Shako, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/943,130

(22) Filed: Nov. 17, 2015

(65) Prior Publication Data

US 2016/0218675 A1 Jul. 28, 2016

(30) Foreign Application Priority Data

Jan. 23, 2015 (JP) .................... 2015-011616

(51) Int. Cl.
| H03F 1/26 | (2006.01) |
| H04B 1/04 | (2006.01) |
| H03F 1/02 | (2006.01) |
| H03F 1/32 | (2006.01) |
| H03F 3/19 | (2006.01) |

(52) U.S. Cl.
CPC .......... *H03F 1/0205* (2013.01); *H03F 1/3247* (2013.01); *H03F 3/19* (2013.01); *H03F 2200/451* (2013.01); *H03F 2201/3233* (2013.01)

(58) Field of Classification Search
CPC .................................. H03F 1/26; H04B 1/04
USPC ................ 330/149; 375/297; 455/114.3
See application file for complete search history.

(56) References Cited

U.S. PATENT DOCUMENTS

| 5,870,668 A * | 2/1999 | Takano .............. H03D 7/168 455/126 |
| 6,757,525 B1 * | 6/2004 | Ishikawa ............ H03F 1/3247 330/149 |
| 2001/0051504 A1 * | 12/2001 | Kubo ................ H03F 1/3247 455/63.1 |
| 2003/0080814 A1 * | 5/2003 | Ode ................... H03F 1/3247 330/149 |
| 2005/0073361 A1 * | 4/2005 | Hamada ............. H03F 1/3247 330/149 |
| 2005/0079834 A1 | 4/2005 | Maniwa et al. |
| 2008/0068191 A1 * | 3/2008 | Maeda ............... H03F 1/3247 340/635 |

FOREIGN PATENT DOCUMENTS

| JP | 2003-218970 | 7/2003 |
| JP | 2003-347944 | 12/2003 |
| JP | 2012-010122 | 1/2012 |
| WO | 03-103167 | 12/2003 |

* cited by examiner

*Primary Examiner* — Patricia T Nguyen
(74) *Attorney, Agent, or Firm* — Fujitsu Patent Center

(57) ABSTRACT

A distortion compensation device compensates a non-linear distortion of a power amplifier included in a wireless communication apparatus that employs the power amplifier to amplify a transmission signal and that transmits the amplified transmission signal. The distortion compensation device includes a bit adjusting unit that, when a width of a distribution of a first parameter among a plurality of calculated parameters is equal to or smaller than a predetermined level, adjusts a bit number of a first address corresponding to the first parameter to be a value obtained by decreasing a first reference bit number and adjusts a bit number of a second address corresponding to a second parameter other than the first parameter to be a value obtained by increasing a second reference bit number.

2 Claims, 7 Drawing Sheets

DISTORTION COMPENSATION DEVICE

CROSS-REFERENCE TO RELATED APPLICATION

This application is based upon and claims the benefit of priority of the prior Japanese Patent Application No. 2015-011616, filed on Jan. 23, 2015, the entire contents of which are incorporated herein by reference.

FIELD

The embodiments discussed herein are related to a distortion compensation device.

BACKGROUND

In recent years, digital communication technology has been developed for wireless communication apparatuses such as portable phones and smartphones, so that the data transfer is performed with a high efficiency. When a multi-level phase modulation method is used as a method for transmitting data, it is important for a wireless communication apparatus provided on the data transmitting side to inhibit non-linear distortions by linearizing amplification characteristics of a transmission-purpose electric-power amplifier and to reduce the electric power (hereinafter, "power") that leaks toward adjacently-positioned channels. Further, in a situation where efforts are exerted to improve the power efficiency by using an amplifier having a low level of linearity, it is desirable to implement a technique for compensating non-linear distortions caused by the low level of linearity. A known example of such a distortion compensation technique is a digital non-linear distortion compensation method called Digital PreDistortion (DPD) method.

In that situation, the wireless communication apparatus may be provided with a distortion compensation unit that compensates the non-linear distortions of the electric power amplifier (hereinafter, "power amplifier"). For example, the distortion compensation unit compares a transmission signal (which may be referred to as a modulation signal or a transmission baseband signal) converted by a Serial/Parallel (S/P) converter into two systems of an I-signal and a Q-signal, with a signal (which may be referred to as a feedback baseband signal) obtained by feeding back a part of the signal resulting from the conversion into the I-signal and the Q-signal and an amplifying process subsequently performed thereon. The distortion compensation unit then calculates a distortion compensation coefficient so that the difference between the two compared signals becomes zero. Further, the distortion compensation unit performs a distortion compensation process by multiplying the transmission signal converted into the I-signal and the Q-signal by the distortion compensation coefficient. The distortion compensation unit compares the transmission signal before the distortion compensation with the signal obtained by feeding back a part of the signal resulting from the amplifying process performed subsequent to the distortion compensation, so as to occasionally update the distortion compensation coefficient in such a manner that the difference between the signals becomes zero.

There are various methods for realizing the DPD process. Generally speaking, Look-up Table (LUT) methods are well known. According to a LUT method, an address is generated based on a parameter (e.g., a signal power) of a transmission signal before the distortion compensation, so that a distortion compensation coefficient in a look-up table is referenced or updated by using the generated address.

Examples of causes of non-linear distortions in output signals (e.g., amplified signals) of a power amplifier include a "memory effect" and an "Idq drift". The "memory effect" is a voltage fluctuation occurring in the power amplifier caused by a momentary signal change.

The "Idq drift" refers to a phenomenon where a drain bias current (Ids) has a transient response, i.e., a drain current observed immediately after entering into an idling state (i.e., the state where the power amplifier has no RF signal input) becomes lower than an initial set value. The "Idq drift" is a phenomenon unique to a GaN (gallium nitride) device, which is an amplifier that has a high output and a high power efficiency. Further, the larger the output of the power amplifier is immediately before entering the idling state, the more significant is the decrease of the drain current, i.e., the more significant is the "Idq drift".

For the purpose of compensating the non-linear distortions caused by the "memory effect" and the "Idq drift" explained above, distortion compensation coefficients each of which corresponds to a different one of multiple-dimensional addresses based on mutually-different "parameters" of the transmission signal may be used. For example, as a one-dimensional address, an address based on the power (decibels [dB] or the amplitude) of the transmission signal serving as a "parameter" may be used. As a two-dimensional address, an address based on a power differential value of the transmission signal serving as another "parameter" may be used. As a three-dimensional address, an address based on a power integral value of the transmission signal serving as yet another "parameter" may be used. In these examples, the two-dimensional address contributes to the removal of distortions caused by the memory effect. The three-dimensional address contributes to the removal of distortions caused by the Idq drift.

Incidentally, due to a rapid increase in the traffic in wireless communication systems in recent years, the number of installed wireless base stations is rapidly increasing. Many wireless base station apparatuses these days are configured so as to include one controlling device and a plurality of wireless devices, and in particular, the number of installed wireless devices is rapidly increasing. For this reason, a problem has arisen where there are not enough locations in which the wireless devices are to be installed. One idea for a solution to this problem is to install one wireless device of which the corresponding range of frequencies is expanded, instead of the related method where a plurality of wireless devices respectively corresponding to a plurality of frequencies are installed. For instance, in a related example, two installment locations are prepared in order to install a wireless device corresponding to the frequency range of 830 to 835 MHz and another wireless device corresponding to the frequency range of 900 to 905 MHz. By replacing these wireless devices with one wireless device corresponding to the frequency range of 830 to 905 MHz, it is possible to reduce the number of installment locations to one, while achieving an equivalent effect. It is desirable to configure the wireless device in this situation so as to be able to handle both a transmission (i.e., a transmission using a broadband signal) using both the band of 830 to 835 MHz and the band of 900 to 905 MHz at the same time and a transmission (i.e., a transmission using a narrowband signal) using only the band of 900 to 905 MHz. Further, to satisfy the wireless characteristics in both of the transmission modes, there is a demand for a distortion compensation method that is compatible with both the broadband signal and the narrowband signal.

In this situation, the more evenly the addresses in the look-up table are used, the higher a precision level of the distortion compensation becomes. There is, however, a possibility that there may be a difference in the distributions of the "parameter" values described above between the broadband signal and the narrowband signal. Thus, there is a possibility that there may be a difference in the distributions of the addresses. In other words, narrowband signals have a tendency of having a narrower distribution of addresses, and there is a possibility that the efficiency in the address allocation may be degraded. To cope with this situation, a method has already been proposed by which a "normalized gain" of addresses is changed in accordance with the state of the signal, so as to be able to evenly use the addresses in the look-up table.

Patent Document 1: Japanese Laid-open Patent Publication No. 2003-347944

However, when the "normalized gain" is set to too large a value, the reference signal per address becomes less. As a result, there is a possibility that the efficiency in the address allocation may, on the contrary, become degraded for the look-up table as a whole. In other words, there is a possibility that the precision level of the distortion compensation may, on the contrary, become degraded.

SUMMARY

According to an aspect of the embodiments, a distortion compensation device compensates a non-linear distortion of a power amplifier included in a wireless communication apparatus that employs the power amplifier to amplify a transmission signal and that transmits the amplified transmission signal. The distortion compensation device includes: a storage unit that stores therein a table holding therein distortion compensation coefficients each of which corresponds to a different one of multiple-dimensional addresses based on mutually-different parameters of the transmission signal; a parameter calculating unit that calculates each of the plurality of parameters of the transmission signal; a bit adjusting unit that, when a width of a distribution of a first parameter among the plurality of calculated parameters is equal to or smaller than a predetermined level, adjusts a bit number of a first address corresponding to the first parameter to be a value obtained by decreasing a first reference bit number and adjusts a bit number of a second address corresponding to a second parameter other than the first parameter to be a value obtained by increasing a second reference bit number; an address calculating unit that calculates, based on the plurality of calculated parameters, the multiple-dimensional addresses including the first address having a first bit number obtained by decreasing the first reference bit number and the second address having a second bit number obtained by increasing the second reference bit number; and an updating unit that updates the table by using the multiple-dimensional addresses calculated by the address calculating unit and one or more updated values for the distortion compensation coefficients calculated based on the pre-amplification transmission signal and the post-amplification transmission signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
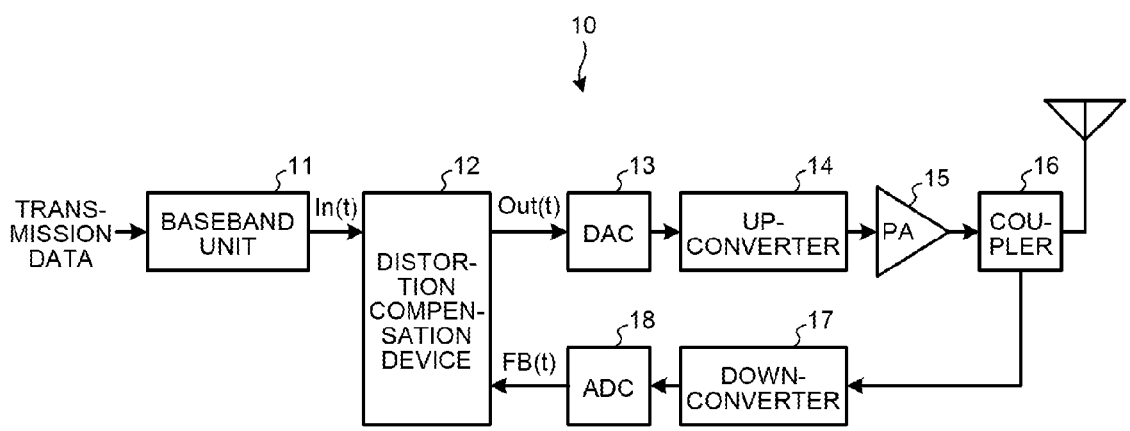
FIG. 1 is a block diagram of an example of a wireless communication apparatus including a distortion compensation device according to a first embodiment.

Preferred embodiments will be explained with reference to accompanying drawings. Possible embodiments of the distortion compensation device disclosed herein are not limited to those described below. Further, some of the configurations having the same functions in any of the embodiments will be referred to by using the same reference characters, and the duplicate explanation will be omitted.

[a] First Embodiment

An Exemplary Configuration of a Wireless Communication Apparatus

FIG. 1 is a block diagram of an example of a wireless communication apparatus including a distortion compensation device according to a first embodiment. In FIG. 1, a wireless communication apparatus 10 includes a baseband unit 11, a distortion compensation device 12, a Digital-to-Analog Converter (DAC) 13, an up-converter 14, a Power Amplifier (PA) 15, and a coupler 16. Further, the wireless communication apparatus 10 includes a down-converter 17 and an Analog-to-Digital Converter (ADC) 18.

The wireless communication apparatus 10 may be installed in, for example, a wireless communication terminal apparatus, a wireless communication base station apparatus, or the like that is used in a wireless communication system.

The baseband unit 11 generates a transmission baseband signal (i.e., a transmission signal) by performing baseband processes such as an encoding process and a modulating process on transmission data input thereto and outputs the generated transmission baseband signal In(t) to the distortion compensation device 12.

The distortion compensation device 12 is a distortion compensation device implementing a Pre-Distortion (PD) method. The distortion compensation device 12 has a Look-Up Table (LUT) that stores therein distortion compensation coefficients each of which corresponds to a different one of multiple-dimensional addresses based on mutually-different "parameters" of the transmission signal. The distortion compensation device 12 generates a PD signal Out(t) by referring to the LUT according to multiple-dimensional addresses each generated based on one of a plurality of parameters and multiplying the transmission baseband signal by the distortion compensation coefficient read from the LUT and outputs the generated PD signal Out(t) to the DAC 13. Further, the distortion compensation device 12 updates the distortion compensation coefficients stored in the LUT based on a difference between the transmission baseband signal In(t) serving as a reference signal and a feedback signal FB(t).

The DAC 13 converts the PD signal from the digital signal into an analog signal and outputs the conversion result to the up-converter 14.

The up-converter 14 up-converts the analog PD signal and outputs the up-converted PD signal to the PA 15.

The PA 15 amplifies the electric power of the up-converted PD signal and outputs the power-amplified signal to the coupler 16.

The coupler 16 distributes the power-amplified signal to an antenna and a feedback path (i.e., the down-converter 17). With this arrangement, the signal output from the PA 15 is fed back to the distortion compensation device 12 via the down-converter 17 and the ADC 18.

The down-converter 17 down-converts the signal input thereto from the coupler 16 and outputs the down-converted signal to the ADC 18.

The ADC 18 converts the down-converted signal from the analog signal into a digital signal and outputs the digital signal resulting from the conversion to the distortion compensation device 12 as the feedback signal FB(t).

An Exemplary Configuration of the Distortion Compensation Device

Figure 2:
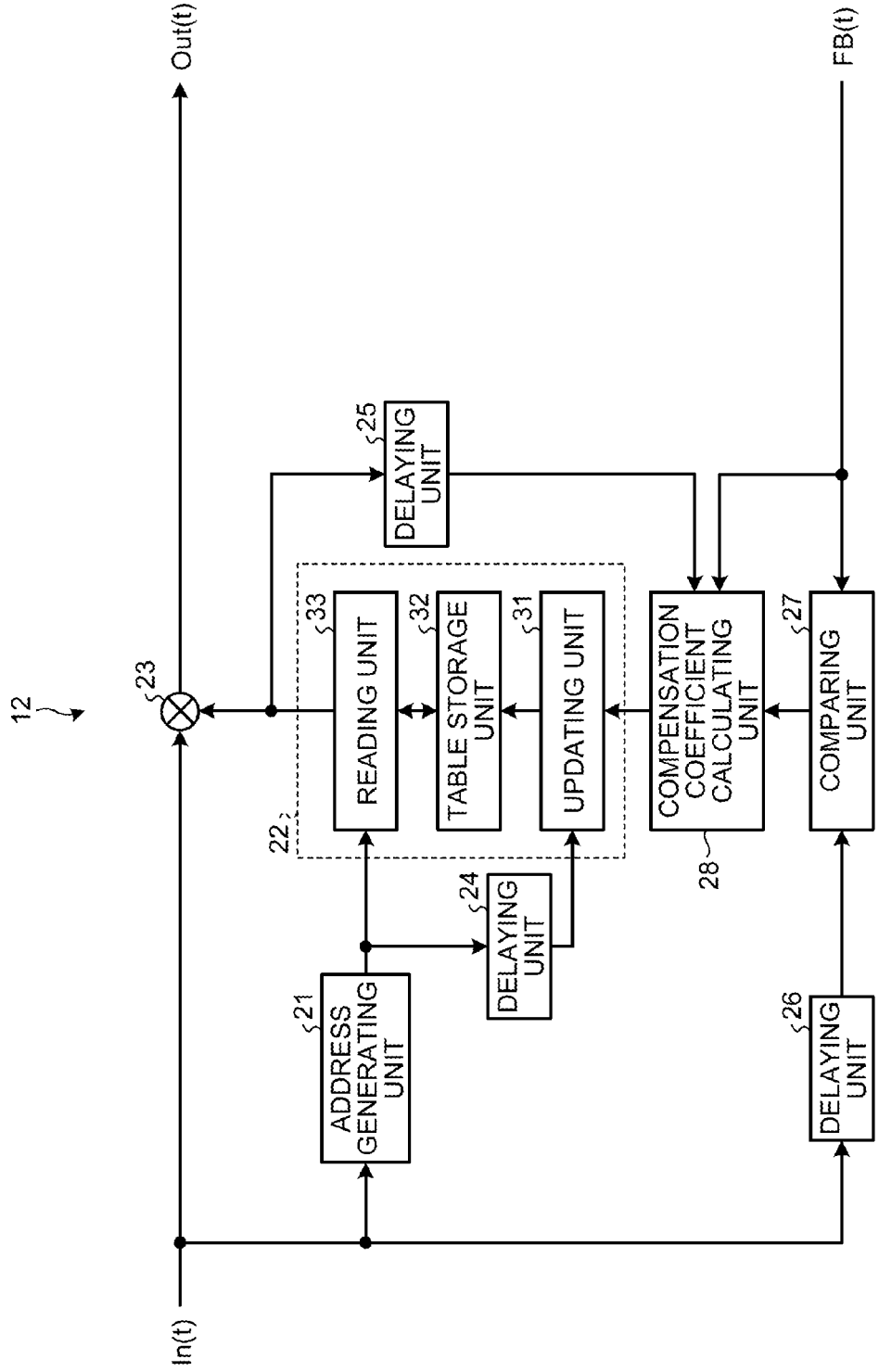
FIG. 2 is a block diagram of an example of the distortion compensation device.

FIG. 2 is a block diagram of an example of the distortion compensation device. In FIG. 2, the distortion compensation device 12 includes an address generating unit 21, a LUT 22, a multiplying unit 23, delaying units 24, 25, and 26, a comparing unit 27, and a compensation coefficient calculating unit 28.

To the address generating unit 21, the transmission baseband signal In(t) is input. Based on the transmission baseband signal In(t) input thereto, the address generating unit 21 generates multiple-dimensional addresses and outputs a combined address obtained by combining together the generated multiple-dimensional addresses. For example, the address generating unit 21 calculates mutually-different three "parameters" with respect to the transmission baseband signal In(t) and calculates three-dimensional addresses based on the three parameters. For example, the three "parameters" are: the electric power (dB or the amplitude) of the transmission signal; an amplitude differential value of the transmission signal; and a power integral value of the transmission signal.

Figure 3:
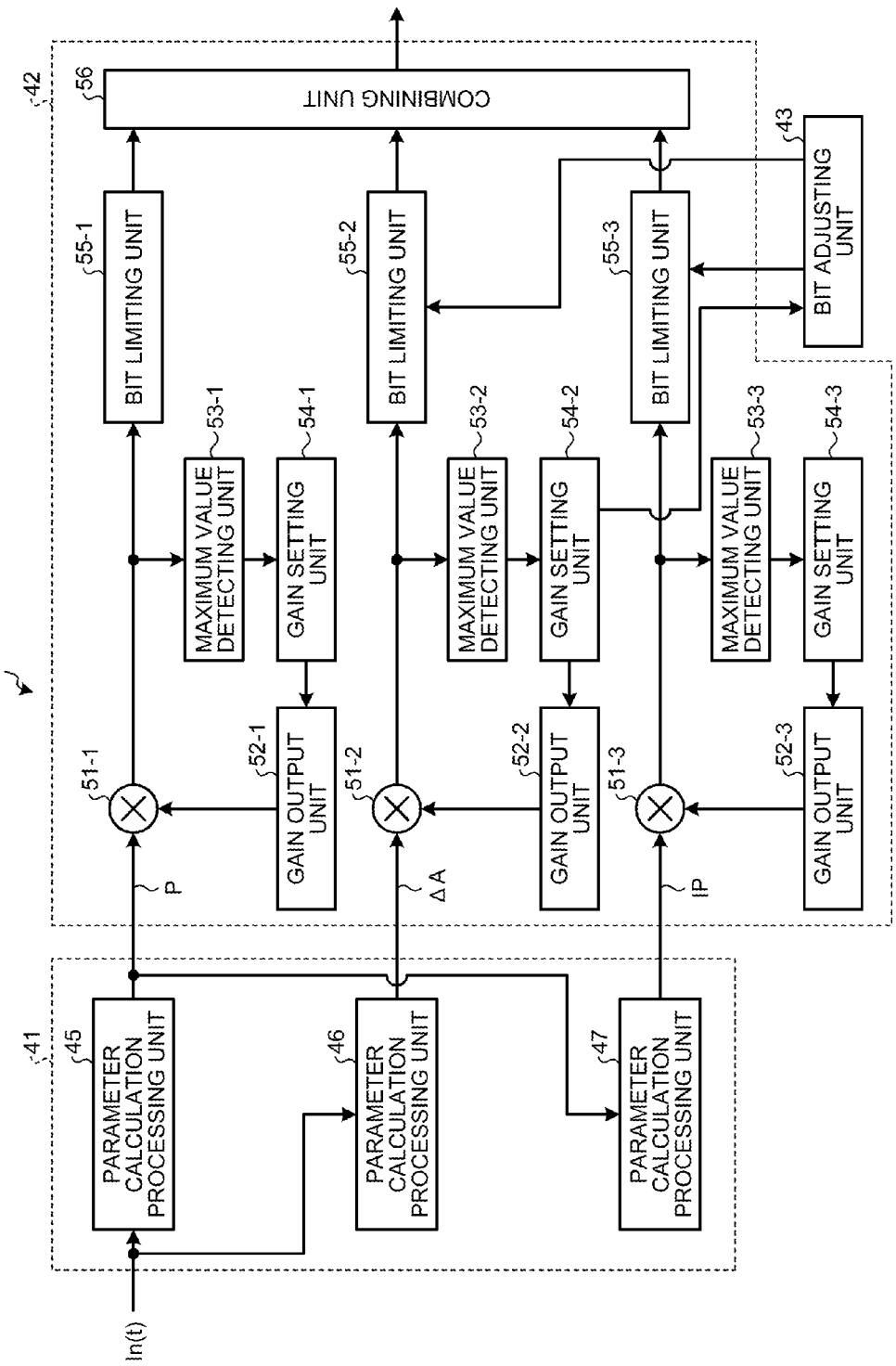
FIG. 3 is a block diagram of an example of an address generating unit.

FIG. 3 is a block diagram of an example of the address generating unit. In FIG. 3, the address generating unit 21 includes a parameter calculating unit 41, an address calculating unit 42, and a bit adjusting unit 43. Further, the parameter calculating unit 41 includes parameter calculation processing units 45, 46, and 47. Further, the address calculating unit 42 includes multiplying units 51-1, 51-2, and 51-3, gain output units 52-1, 52-2, and 52-3, maximum value detecting units 53-1, 53-2, and 53-3, gain setting units 54-1, 54-2, and 54-3, bit limiting units 55-1, 55-2, and 55-3, and a combining unit 56. In the following explanations, the parameter calculation processing units 45, 46, and 47 may be referred to as a first parameter calculation processing unit, a second parameter calculation processing unit, and a third parameter calculation processing unit, respectively.

Figure 4:
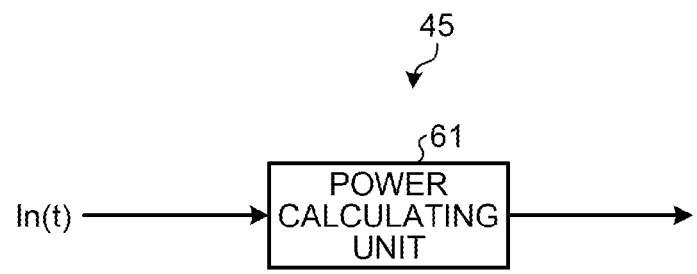
FIG. 4 is a diagram of an example of a first parameter calculation processing unit.

The parameter calculation processing unit 45 calculates an electric power (i.e., a power value $P=In(t)^2$) of the transmission baseband signal In(t) input thereto and outputs the calculated power value P to the parameter calculation processing unit 47 and the address calculating unit 42, as an "X-axis parameter". As illustrated in FIG. 4, the parameter calculation processing unit 45 includes a power calculating unit 61. The power calculating unit 61 calculates the electric power of the transmission baseband signal In(t) input thereto. FIG. 4 is a diagram of an example of the first parameter calculation processing unit. In this situation, the power value P is output as, for example, a 10-bit signal (i.e., a digital signal capable of expressing 1,024 statuses).

Figure 5:
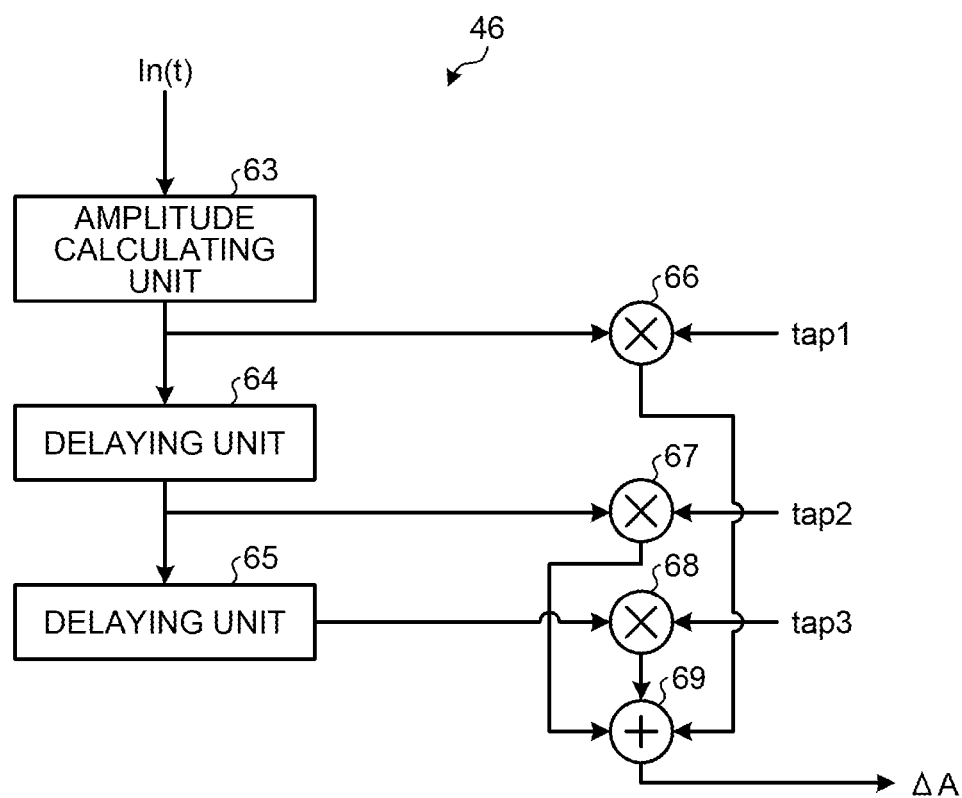
FIG. 5 is a diagram of an example of a second parameter calculation processing unit.

Returning to the description of FIG. 3, the parameter calculation processing unit 46 detects the amplitude of the transmission baseband signal In(t) input thereto, calculates a differential value of the detected amplitude (i.e., an amplitude difference ΔA), and outputs the calculated amplitude difference ΔA to the address calculating unit 42, as a "Y-axis parameter". As illustrated in FIG. 5, the parameter calculation processing unit 46 includes an amplitude calculating unit 63, delaying units 64 and 65, multiplying units 66, 67, and 68, and an adding unit 69. FIG. 5 is a diagram of an example of the second parameter calculation processing unit. In this situation, for example, the amplitude difference ΔA is output as a 10-bit signal (i.e., a digital signal capable of expressing 1,024 statuses).

In FIG. 5, the amplitude calculating unit 63 calculates an amplitude A of the transmission baseband signal In(t) input thereto. The amplitude calculating unit 63 outputs the calculated amplitude A to the delaying unit 64 and the multiplying unit 66.

The delaying unit 64 delays the amplitude A output from the amplitude calculating unit 63 by a predetermined time period (e.g., one sample period) and outputs the result to the delaying unit 65 and the multiplying unit 67. The delaying unit 65 delays the amplitude A output from the delaying unit 64 by a predetermined time period (e.g., one sample period) and outputs the result to the multiplying unit 68.

The multiplying unit 66 multiplies the amplitude A output from the amplitude calculating unit 63 by a tap coefficient tap1 and outputs the result to the adding unit 69.

The multiplying unit 67 multiplies the amplitude A output from the delaying unit 64 by a tap coefficient tap2 and outputs the result to the adding unit 69.

The multiplying unit 68 multiplies the amplitude A output from the delaying unit 65 by a tap coefficient tap3 and outputs the result to the adding unit 69.

The adding unit 69 adds together the signals output from the multiplying units 66, 67, and 68. The result of the addition by the adding unit 69 indicates the amplitude difference AA of the transmission baseband signal In(t) at mutually different three points in time (times).

Figure 6:
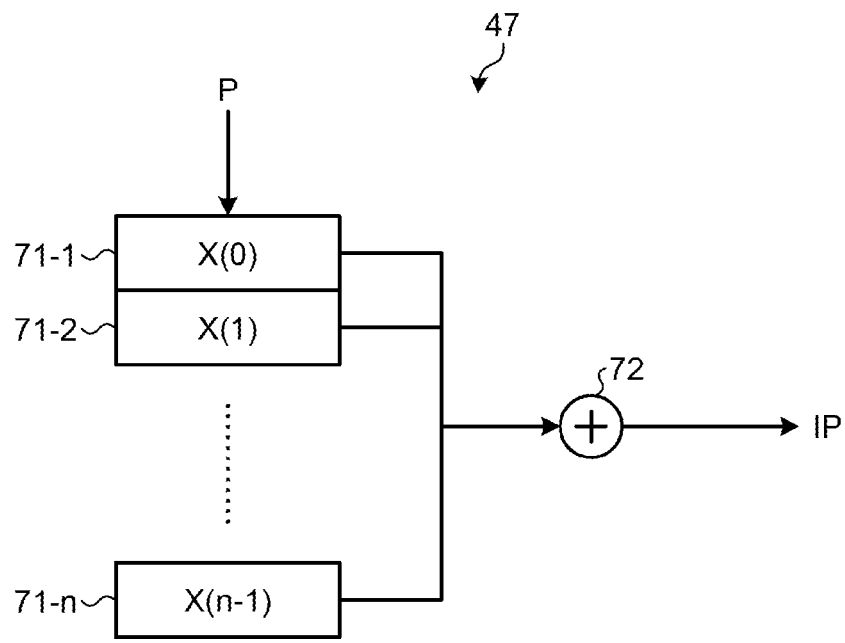
FIG. 6 is a diagram of an example of a third parameter calculation processing unit.

Returning to the description of FIG. 3, the parameter calculation processing unit 47 calculates a moving integral value IP of the power value P calculated by the parameter calculation processing unit 45 and outputs the calculated moving integral value IP to the address calculating unit 42 as a "Z-axis parameter". FIG. 6 is a diagram of an example of the third parameter calculation processing unit. In FIG. 6, the parameter calculation processing unit 47 includes memories 71-1 to 71-n and an adding unit 72. The memory 71-1 temporarily stores therein the power value P that was received most recently from the parameter calculation processing unit 45. The memories 71-2 to 71-n temporarily store therein the power values P that are gradually older by one sample period in accordance with the increase in the suffix numbers from 2 to n. In other words, the memories 71-1 to 71-n store therein the power values P which correspond to mutually-different times and of which the total quantity is equal to n. Further, as many power values P as n that are stored in the memories 71-1 to 71-n are added together by the adding unit 72, so as to calculate the moving integral value IP. When the power values P stored in the memories 71-1 to 71-n of which the quantity is equal to n are output to the adding unit 72, the power values P stored in the memories 71-2 to 71-n are updated with the power values P stored in the memories 71-1 to 71-(n-1), respectively, so that the power value P that is subsequently received from the parameter calculation processing unit 45 is temporarily stored into the memory 71-1. In this situation, the moving integral value IP is output as, for example, a 10-bit signal (i.e., a digital signal capable of expressing 1,024 statuses).

Returning to the description of FIG. 3, the address calculating unit 42 calculates the multiple-dimensional addresses based on the plurality of parameters calculated by the parameter calculating unit 41.

For example, the maximum value detecting unit 53-1 detects the maximum value among the multiplication results output from the multiplying unit 51-1 during a predetermined time period. Based on the maximum value detected by the maximum value detecting unit 53-1, the gain setting unit 54-1 identifies a gain closest to an "X-axis reference width" that can be expressed with an "X-axis reference bit number" and sets the identified gain into the gain output unit 52-1, as an "X-axis setting gain". In this situation, the gain setting unit 54-1 may identify such a gain that, when being multiplied by the maximum value detected by the maximum value detecting unit 53-1, causes the multiplication result to be closest to an "X-axis address target maximum value" that can be expressed with the "X-axis reference bit number" and may set the identified gain into the gain output unit 52-1 as the "X-axis setting gain".

The "X-axis reference bit number" corresponds to the quantity of the "X-axis addresses" in the look-up table and is 8 (bits), for example. In that situation, the quantity of the "X-axis addresses" in the look-up table is 1,024. The gain output unit 52-1 outputs the X-axis setting gain to the multiplying unit 51-1. The multiplying unit 51-1 multiplies the power value P serving as the X-axis parameter by the X-axis setting gain output from the gain output unit 52-1 and outputs the multiplication result to the maximum value detecting unit 53-1 and the bit limiting unit 55-1. The bit limiting unit 55-1 generates an "X-axis address" by removing the most significant two bits of the X-axis parameter expressed with 10 bits and outputs the generated "X-axis address" to the combining unit 56. In this situation, the X-axis parameter is expressed with 10 bits, which is larger than the "X-axis reference bit number", for the purpose of ensuring that the maximum value detecting unit 53-1 is able to detect the maximum value, even if the power value P happens to be such a value that deviates from the "X-axis reference width" that can be expressed with 8 bits.

Further, the maximum value detecting unit 53-3 detects the maximum value among the multiplication results output from the multiplying unit 51-3 during a predetermined time period. Based on the maximum value detected by the maximum value detecting unit 53-3, the gain setting unit 54-3 identifies a gain closest to a "Z-axis reference width" that can be expressed with a "Z-axis reference bit number" and sets the identified gain into the gain output unit 52-3, as a "Z-axis setting gain". In this situation, the gain setting unit 54-3 may identify such a gain that, when being multiplied by the maximum value detected by the maximum value detecting unit 53-3, causes the multiplication result to be closest to a "Z-axis address target maximum value" that can be expressed with the "Z-axis reference bit number" and may set the identified gain into the gain output unit 52-3 as the "Z-axis setting gain".

The "Z-axis reference bit number" corresponds to the quantity of the "Z-axis addresses" in the look-up table and is 4 (bits), for example. In that situation, the quantity of the "Z-axis addresses" in the look-up table is 16. The gain output unit 52-3 outputs the Z-axis setting gain to the multiplying unit 51-3. The multiplying unit 51-3 multiplies the moving integral value IP serving as the Z-axis parameter by the Z-axis setting gain output from the gain output unit 52-3 and outputs the multiplication result to the maximum value detecting unit 53-3 and the bit limiting unit 55-3. The bit limiting unit 55-3 generates a "Z-axis address" by removing as many most significant bits of the Z-axis parameter expressed with 10 bits as a "Z-axis removal bit number" received from the bit adjusting unit 43 and outputs the generated "Z-axis address" to the combining unit 56.

Further, the maximum value detecting unit 53-2 detects the maximum value among the multiplication results output from the multiplying unit 51-2 during a predetermined time period. Based on the maximum value detected by the maximum value detecting unit 53-2, the gain setting unit 54-2 identifies a certain value that is within a "gain tolerance range" and that, when being multiplied by a Y-axis parameter distribution width, causes the multiplication result (representing a width) to be closest to a "Y-axis reference width" that can be expressed with a "Y-axis reference bit number" and sets the identified certain value into the gain output unit 52-2, as a "Y-axis setting gain". In this situation, the gain setting unit 54-2 may identify a certain value that is within the "gain tolerance range" and that, when being multiplied by the maximum value detected by the maximum value detecting unit 53-2, causes the multiplication result to be closest to a "Y-axis address target maximum value" that can be expressed with the "Y-axis reference bit number" and may set the identified certain value into the gain output unit 52-2 as the "Y-axis setting gain".

The "gain tolerance range" is defined by a "gain smallest value" and a "gain largest value" that are set in advance and is the range from the "gain smallest value" to the "gain largest value". The "Y-axis reference bit number" corresponds to the quantity of the "Y-axis addresses" in the look-up table and is 5 (bits), for example. In that situation, the quantity of the "Y-axis addresses" in the look-up table is 32. Further, the gain output unit 52-2 outputs the Y-axis setting gain to the multiplying unit 51-2. The multiplying unit 51-2 multiplies the amplitude difference ΔA serving as the Y-axis parameter by the Y-axis setting gain output from the gain output unit 52-2 and outputs the multiplication result to the maximum value detecting unit 53-2 and the bit limiting unit 55-2. The bit limiting unit 55-2 generates a "Y-axis address" by removing as many most significant bits of the Y-axis parameter expressed with 10 bits as a "Y-axis removal bit number" received from the bit adjusting unit 43 and outputs the generated "Y-axis address" to the combining unit 56.

In this situation, if the certain value described above is equal to the "gain largest value", the gain setting unit 54-2 outputs a "bit adjustment control signal" to the bit adjusting unit 43. Further, when having received the "bit adjustment control signal" (i.e., when the abovementioned certain value is equal to the "gain largest value"), the bit adjusting unit 43 increases the "Y-axis removal bit number" and decreases the "Z-axis removal bit number". In other words, the bit adjusting unit 43 carries out bit adjustment control by decreasing the bit number of the Y-axis address and increasing the bit number of the Z-axis address. For example, at normal times, the "Y-axis removal bit number" is set to 5 bits, whereas the "Z-axis removal bit number" is set to 6 bit. When the abovementioned certain value is equal to the "gain largest value", the "Y-axis removal bit number" is changed to 6 bits, whereas the "Z-axis removal bit number" is changed to 5 bits. In this manner, when the distribution width of the Y-axis address is smaller than a predetermined level, the bit adjusting unit 43 clips the "Y-axis setting gain" with the "gain largest value" and decreases the bit number of the Y-axis address, while increasing the bit number of the Z-axis address, instead of infinitely raising the value of the "Y-axis setting gain". With these arrangements, it is possible to improve the efficiency in the address allocation. As a result, it is possible to improve the precision level of the distortion compensation.

The combining unit 56 generates the combined address by combining together, the "X-axis address", the "Y-axis address", and the "Z-axis address" input thereto and outputs the generated combined address to the LUT 22 and the delaying unit 24.

Returning to the description of FIG. 2, the LUT 22 reads a distortion compensation coefficient corresponding to the combined address Adr(t) calculated by the address generating unit 21 from a distortion compensation coefficient table and outputs the read distortion compensation coefficient to the multiplying unit 23 and the delaying unit 25. Further, the LUT 22 updates the distortion compensation coefficient table with an updated value for the distortion compensation coefficient calculated by the compensation coefficient calculating unit 28 and with an updated address received from the delaying unit 24.

For example, as illustrated in FIG. 2, the LUT 22 includes an updating unit 31, a table storage unit 32, and a reading unit 33.

The updating unit 31 performs the updating process of updating the distortion compensation coefficient table with the updated value for the distortion compensation coefficient calculated by the compensation coefficient calculating unit 28 and with the updated address received from the delaying unit 24.

The table storage unit 32 stores therein the "distortion compensation coefficient table" storing therein a plurality of distortion compensation coefficients corresponding to a plurality of combined addresses, respectively. As explained above, each of the combined addresses includes an "X-axis address", a "Y-axis address", and a "Z-axis address".

The reading unit 33 reads the distortion compensation coefficient corresponding to the combined address Adr(t) calculated by the address generating unit 21 from the distortion compensation coefficient table and outputs the read distortion compensation coefficient to the multiplying unit 23 and the delaying unit 25.

The multiplying unit 23 multiplies the transmission baseband signal In(t) by the distortion compensation coefficient obtained from the LUT 22 and outputs the transmission baseband signal In(t) on which the distortion compensation process has been performed (i.e., a PD signal Out(t)) to the DAC 13.

The delaying unit 24 delays the combined address Adr(t) by a delay amount d1 and outputs the delayed combined address Adr(t) to the updating unit 31, as the updated address. The delay amount d1 corresponds to a total processing delay amount for all of the multiplying unit 23, the DAC 13, the up-converter 14, the PA 15, the coupler 16, the down-converter 17, the ADC 18, the comparing unit 27, and the compensation coefficient calculating unit 28.

The delaying unit 25 delays the distortion compensation coefficient output from the LUT 22 by a delay amount d2 and outputs the delayed distortion compensation coefficient to the compensation coefficient calculating unit 28. The delay amount d2 corresponds to a total processing delay amount for all of the multiplying unit 23, the DAC 13, the up-converter 14, the PA 15, the coupler 16, the down-converter 17, the ADC 18, and the comparing unit 27.

The delaying unit 26 delays the transmission baseband signal In(t) serving as the reference signal by a delay amount d3 and outputs the delayed reference signal to the comparing unit 27. The delay amount d3 corresponds to a total processing delay amount for all of the multiplying unit 23, the DAC 13, the up-converter 14, the PA 15, the coupler 16, the down-converter 17, and the ADC 18. As a result, the transmission baseband signal In(t) serving as the reference signal and the feedback signal FB(t) corresponding to the transmission baseband signal In(t) are simultaneously input to the comparing unit 27.

The comparing unit 27 compares the transmission baseband signal In(t) serving as the reference signal with the feedback signal FB(t) so as to calculate a difference signal e(t) between the two signals and outputs the calculated difference signal e(t) to the compensation coefficient calculating unit 28.

The compensation coefficient calculating unit 28 calculates the updated value for the distortion compensation coefficient, based on the difference signal e(t) received from the comparing unit 27 and the distortion compensation coefficient received via the delaying unit 25 and outputs the calculated updated value for the distortion compensation coefficient to the updating unit 31.

Figure 7:
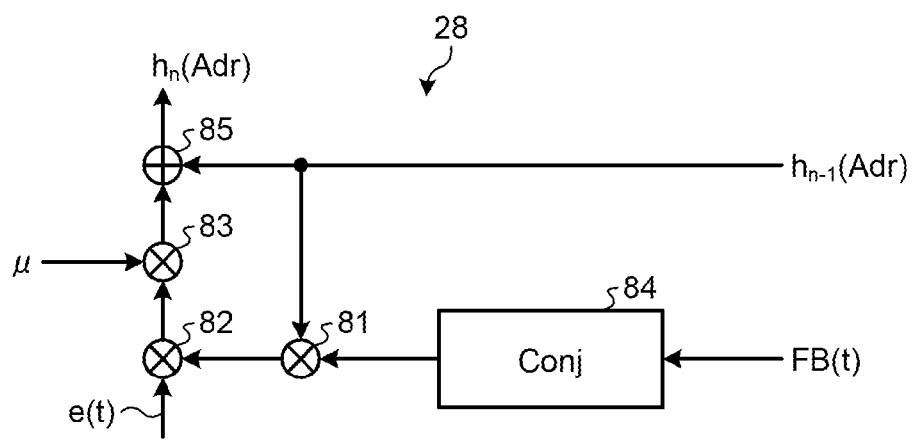
FIG. 7 is a diagram of an example of a compensation coefficient calculating unit.

FIG. 7 is a diagram of an example of the compensation coefficient calculating unit. In FIG. 7, the compensation coefficient calculating unit 28 includes multiplying units 81, 82, and 83, a conjugate complex signal output unit (Conj) 84, and an adding unit 85.

The conjugate complex signal output unit 84 outputs a complex conjugate FB*(t) of the feedback signal FB(t) input thereto, to the multiplying unit 81.

The multiplying unit 81 multiplies a distortion compensation coefficient hn−1(Adr) received via the delaying unit 25 by FB*(t) and outputs the multiplication result (hn−1(Adr)×FB*(t)) to the multiplying unit 82.

The multiplying unit 82 multiplies the difference signal e(t) received from the comparing unit 27 by the multiplication result (hn−1(Adr)×FB*(t)) received from the multiplying unit 81 and outputs the multiplication result (hn−1(Adr)×FB*(t)×the difference signal e(t)) to the multiplying unit 83.

The multiplying unit 83 multiplies a step size parameter μ by the multiplication result (hn−1(Adr)×FB*(t)×the difference signal e(t)) received from the multiplying unit 82 and outputs the multiplication result (hn−1(Adr)×FB*(t)×the difference signal e(t)×μ) to the adding unit 85.

The adding unit 85 adds together the distortion compensation coefficient hn−1(Adr) received via the delaying unit 25 and the multiplication result (hn−1(Adr)×FB*(t)×the difference signal e(t)×μ) received from the multiplying unit 83 and outputs the addition result (hn−1(Adr)+hn−1(Adr)×FB*(t)×the difference signal e(t)×μ) to the updating unit 31 as an updated value (hn(Adr)).

An example of an operation of the distortion compensation device

Figure 8:
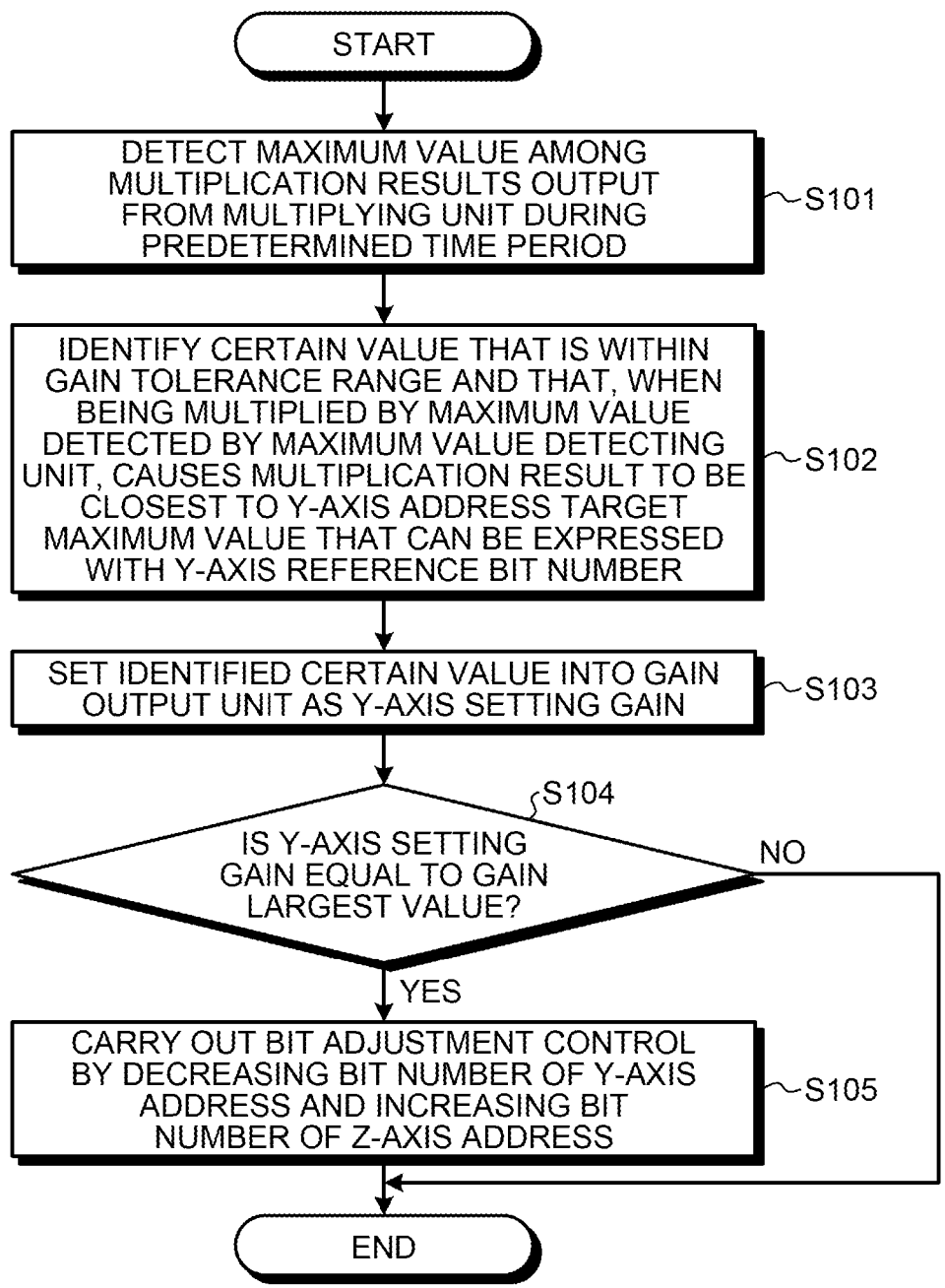
FIG. 8 is a flowchart illustrating an example of a processing operation of the distortion compensation device.

An example of a processing operation performed by the distortion compensation device 12 configured as described above will be explained. In the present example, processing operations performed by the maximum value detecting unit 53-2, the gain setting unit 54-2, and the bit adjusting unit 43 will primarily be explained. FIG. 8 is a flowchart illustrating an example of the processing operation of the distortion compensation device.

The maximum value detecting unit 53-2 detects the maximum value among the multiplication results output from the multiplying unit 51-2 during a predetermined time period (step S101).

The gain setting unit 54-2 identifies a certain value that is within the "gain tolerance range" and that, when being multiplied by the maximum value detected by the maximum value detecting unit 53-2, causes the multiplication result to be closest to the "Y-axis address target maximum value" that can be expressed with the "Y-axis reference bit number" (step S102). As mentioned above, the "gain tolerance range" is defined by the "gain smallest value" and the "gain largest value" that are set in advance and is the range from the "gain smallest value" to the "gain largest value".

The gain setting unit 54-2 sets the identified certain value into the gain output unit 52-2 as the "Y-axis setting gain" (step S103).

The gain setting unit 54-2 judges whether the "Y-axis setting gain" is equal to the "gain largest value" or not (step S104).

If the "Y-axis setting gain" is equal to the "gain largest value" (step S104: Yes), the bit adjusting unit 43 carries out the bit adjustment control on the bit limiting unit 55-2 and the bit limiting unit 55-3 by decreasing the bit number of the Y-axis address and increasing the bit number of the Z-axis address (step S105). On the contrary, if the "Y-axis setting gain" is smaller than the "gain largest value" (step S104: No), the processing flow ends.

In the present example, as mentioned above, the Y-axis reference bit number is set to 5 bits, whereas the Z-axis reference bit number is set to 4 bits. Further, the Y-axis address target minimum value and the Y-axis address target maximum value are set to "−16" and "+15", respectively. The Z-axis address target minimum value and the Z-axis address target maximum value are set to "0" and "+15", respectively. Further, the gain largest value that defines the gain tolerance range mentioned above is set to "32/160".

Further, let us discuss an example in which, during a first time period, the value of the amplitude difference AA falls in the range from −160 to +150, whereas the moving integral value IP falls in the range from 0 to 500. In this situation, when the Y-axis gain is set to 16/160, the value of $\Delta A \times 16/160$ falls in the range from −16 to +15, and it is therefore possible to fully utilize the Y-axis address. Further, when the Z-axis gain is set to 15/500, the value of IP×15/500 falls in the range from 0 to +15, and it is therefore possible to fully utilize the Z-axis address.

Further, let us discuss an example in which, during a second time period, the value of the amplitude difference AA falls in the range from −40 to +38, whereas the moving integral value IP falls in the range from 0 to 500. In this situation, if the Y-axis gain was kept at 16/160, the value of $\Delta A \times 16/160$ would fall in the range from −4 to +4, and the range from −16 to −5 and the range from +5 to +15 would be wasted. The Y-axis gain that makes it possible to fully utilize the used address is 64/160. However, as mentioned above, when the "normalized gain" is set to too large a value, the reference signal per address becomes less. As a result, there is a possibility that the efficiency in the address allocation may, on the contrary, become degraded for the look-up table as a whole. In other words, there is a possibility that the precision level of the distortion compensation may, on the contrary, become degraded.

To cope with this situation, when the distribution width of the Y-axis address is smaller than a predetermined level, the Y-axis setting gain is clipped at the gain largest value (32/160 in the present example), instead of infinitely raising the value of the "Y-axis setting gain". As a result, the Y-axis address is in the range from −8 to +8. Further, the bit number of the Y-axis address is decreased, whereas the bit number of the Z-axis is increased. With these arrangements, it is possible to improve the efficiency in the address allocation, and as a result, it is possible to improve the precision level of the distortion compensation. As additional information, because the bit number of the Z-axis address is expanded, it becomes easier to follow amplification characteristics influenced by a fluctuation in a power moving average, and it is therefore possible to improve the distortion compensation capability.

As explained above, according to the present embodiment, the distortion compensation device 12 is configured so that, when the width of the distribution of the Y-axis parameter is equal to or smaller than the predetermined level, the bit adjusting unit 43 adjusts the bit number of the Y-axis address corresponding to the Y-axis parameter to be a value obtained by decreasing the Y-axis reference bit number and adjusts the bit number of the Z-axis address corresponding to the Z-axis parameter other than the Y-axis parameter to be a value obtained by increasing the Z-axis reference bit number.

The distortion compensation device 12 configured in this manner is able to improve the efficiency in the address allocation and, as a result, is able to improve the precision level of the distortion compensation.

The explanation above is based on the assumption that the bit number is given from the Y-axis address to the Z-axis address. However, possible embodiments are not limited to this example. For instance, it is acceptable to set, conversely, a tolerance range for the Z-axis setting gain and, when the Z-axis setting gain is equal to the gain largest value of the tolerance range, the bit number is given from the Z-axis address to the Y-axis address under the control of the bit adjusting unit 43. Further, the bit number does not necessarily have to be given and received between the Y-axis address and the Z-axis address. The bit number may be given and received between the X-axis address and the Y-axis address or between the X-axis address and the Z-axis address. Further, the bit number may be given and received among the three dimensions (i.e., among the X-axis address, the Y-axis address, and the Z-axis address). In other words, it is acceptable to use any method as long as it is possible to make a bit adjustment when the width of the distribution of a first parameter among the plurality of parameters is equal to or smaller than the predetermined level, by adjusting the bit number of a first address corresponding to the first parameter to be a value obtained by decreasing a first reference bit number and adjusting the bit number of another address corresponding to another parameter other than the first parameter to be a value obtained by increasing a second reference bit number.

The explanation above is based on the assumption that the three-dimensional addresses (i.e., the X-axis address, the Y-axis address, and the Z-axis address) are used. However, possible embodiments are not limited to this example. For instance, it is also acceptable to use two-dimensional addresses such as the X-axis address and the Y-axis address. In other words, of the two parameters, the X-axis parameter may be the power value P, whereas the Y-axis parameter may be the amplitude difference ΔA. Alternatively, of the two parameters, the X-axis parameter may be the power value P, whereas the Y-axis parameter may be the moving integral value IP.

Further, as one of the parameters, a phase difference Δθ may be used in place of the amplitude difference ΔA. In that situation, the parameter calculation processing unit illustrated in FIG. 5 may be configured so that a phase calculating unit that calculates a phase θ of the transmission baseband signal In(t) input thereto is provided in place of the amplitude calculating unit.

[b] Other Embodiments

The constituent elements of the functional units illustrated in the first embodiment do not necessarily have to physically be configured as indicated in the drawings. In other words, the specific modes of distribution and integration of the functional units are not limited to those illustrated in the drawings. It is acceptable to functionally or physically distribute or integrate all or a part of the functional units in any arbitrary units, depending on various loads and the status of use.

Further, all or an arbitrary part of the various types of processing functions implemented by the devices and the apparatuses may be executed by a Central Processing Unit (CPU) (or a Micro Processing Unit [MPU]) or a microcomputer such as a Micro Controller Unit (MCU). Further, all or an arbitrary part of the various types of processing functions may be realized with a computer program analyzed and executed by a CPU (or an MPU or a microcomputer such as an MCU) or may be realized with hardware using wired logic.

The distortion compensation device according to the first embodiment may be realized with, for example, a hardware configuration as described below.

Figure 9:
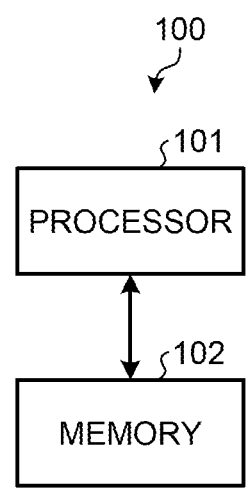
FIG. 9 is a diagram of an exemplary hardware configuration of a distortion compensation device.

FIG. 9 is a diagram of an exemplary hardware configuration of a distortion compensation device. As illustrated in FIG. 9, a distortion compensation device 100 includes a processor 101 and a memory 102. Examples of the processor 101 include a CPU, a Digital Signal Processor (DSP), and a Field Programmable Gate Array (FPGA). Examples of the memory 102 include a Random Access Memory (RAM) such as a Synchronous Dynamic Random Access Memory (SDRAM), a Read-Only Memory (ROM), and a flash memory.

The various types of processing functions implemented by the distortion compensation device according to the first embodiment may be realized by causing a processor to execute one or more computer programs stored in any of various types of memories such as a non-volatile storage medium. In other words, computer programs corresponding to the processes performed by the address generating unit 21, the updating unit 31, the reading unit 33, the multiplying unit 23, the delaying units 24, 25, and 26, the comparing unit 27, and the compensation coefficient calculating unit 28 may be recorded on the memory 102, so that the computer programs are executed by the processor 101. Further, the table storage unit 32 may be realized with the memory 102.

The explanation above is based on the example in which the various types of processing functions implemented by the distortion compensation device according to the first embodiment are executed by the single processor 101; however, possible embodiments are not limited to this example. The various types of processing functions may be executed by two or more processors.

According to at least one aspect of the disclosure herein, it is possible to improve the precision level of the distortion compensation.

All examples and conditional language recited herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation device that compensates a non-linear distortion of a power amplifier included in a wireless communication apparatus that employs the power amplifier to amplify a transmission signal and that transmits the amplified transmission signal, the distortion compensation device comprising:
    a storage unit that stores therein a table holding therein distortion compensation coefficients each of which corresponds to a different one of multiple-dimensional addresses based on mutually-different parameters of the transmission signal;
    a parameter calculating unit that calculates each of the plurality of parameters of the transmission signal;
    a bit adjusting unit that, when a width of a distribution of a first parameter among the plurality of calculated parameters is equal to or smaller than a predetermined level, adjusts a bit number of a first address corresponding to the first parameter to be a value obtained by decreasing a first reference bit number and adjusts a bit number of a second address corresponding to a second parameter other than the first parameter to be a value obtained by increasing a second reference bit number;
    an address calculating unit that calculates, based on the plurality of calculated parameters, the multiple-dimensional addresses including the first address having a first bit number obtained by decreasing the first reference bit number and the second address having a second bit number obtained by increasing the second reference bit number; and
    an updating unit that updates the table by using the multiple-dimensional addresses calculated by the address calculating unit and one or more updated values for the distortion compensation coefficients calculated based on the pre-amplification transmission signal and the post-amplification transmission signal.

2. The distortion compensation device according to claim 1, wherein
    the address calculating unit includes:
        a gain multiplying unit that multiplies the first parameter calculated by the parameter calculating unit by a setting gain and that outputs a multiplication result;
        a detecting unit that detects a maximum value of the multiplication result;
        a gain setting unit that, based on the detected maximum value of the multiplication result, identifies a certain value that is within a gain tolerance range between a gain smallest value and a gain largest value and that, when being multiplied by the width of the distribution of the first parameter, causes a multiplication result representing a width to be closest to a reference width that is expressed with the first reference bit number and that sets the identified certain value as the setting gain; and a bit limiting unit that, when the setting gain that was set is equal to the gain largest value, generates the first address by limiting a bit number of the multiplication result to the first bit number.

* * * * *